(12) United States Patent
Asano et al.

(10) Patent No.: US 7,671,356 B2
(45) Date of Patent: Mar. 2, 2010

(54) ELECTRICALLY REWRITABLE NON-VOLATILE MEMORY ELEMENT AND METHOD OF MANUFACTURING THE SAME

(75) Inventors: Isamu Asano, Tokyo (JP); Tyler A. Lowrey, Rochester Hills, MI (US)

(73) Assignee: Elpida Memory, Inc., Tokyo (JP)

( * ) Notice: Subject to any disclaimer, the term of this patent is extended or adjusted under 35 U.S.C. 154(b) by 215 days.

(21) Appl. No.: 11/265,275

(22) Filed: Nov. 3, 2005

(65) Prior Publication Data
US 2007/0097738 A1   May 3, 2007

(51) Int. Cl.
*H01L 47/00* (2006.01)
(52) U.S. Cl. .................................. 257/4; 257/E45.002
(58) Field of Classification Search ................ 257/4, 257/E45.002; 438/3
See application file for complete search history.

(56) References Cited

U.S. PATENT DOCUMENTS

| | | | |
|---|---|---|---|
| 5,536,947 A | 7/1996 | Klersy et al. | |
| 7,067,865 B2 * | 6/2006 | Lung | 257/296 |
| 7,105,396 B2 * | 9/2006 | Hwang et al. | 438/198 |
| 7,202,493 B2 * | 4/2007 | Lung | 257/4 |
| 7,214,957 B2 * | 5/2007 | Ryoo et al. | 257/2 |
| 7,242,019 B2 * | 7/2007 | Wicker | 257/2 |
| 7,247,876 B2 * | 7/2007 | Lowrey | 257/19 |
| 2004/0042316 A1 * | 3/2004 | Lee et al. | 365/223 |
| 2004/0087074 A1 | 5/2004 | Hwang et al. | |
| 2004/0164290 A1 | 8/2004 | Yi et al. | |
| 2005/0029503 A1 * | 2/2005 | Johnson | 257/4 |
| 2007/0069249 A1 * | 3/2007 | Hayakawa | 257/246 |
| 2007/0097737 A1 * | 5/2007 | Asano et al. | 365/163 |

OTHER PUBLICATIONS

Y. N. Hwang., et al. "Writing Current Reduction for High-density Phase-change RAM," 2003 IEEE, pp. 1-4.
Y. H. Ha., et al. "An Edge Contact Type Cell for Phase Change RAM Featuring Very Low Power Consumption," 2003 Symposium on VLSI Technology Digest of Technical Papers, pp. 1-2.
Chinese Office Action, w/ an English translation thereof, issued in Patent Application No. 2006101439219 dated on Jul. 18, 2008.

\* cited by examiner

*Primary Examiner*—W. David Coleman
*Assistant Examiner*—Sun M Kim
(74) *Attorney, Agent, or Firm*—McDermott Will & Emery LLP

(57) ABSTRACT

A non-volatile memory element comprising a bottom electrode 12, a top electrode 17 provided on the bottom electrode 12, and a recording layer 18 containing phase change material connected between the bottom electrode 12 and the top electrode 17. In accordance with this invention, the top electrode 17 is in contact with a growth initiation surface 18a of the recording layer 17. This structure can be obtained by forming the top electrode 17 before the recording layer 18, resulting in a three-dimensional structure. This decreases heat dissipation to the bit line without increasing the thickness of the recording layer 18.

7 Claims, 16 Drawing Sheets

ELECTRICALLY REWRITABLE NON-VOLATILE MEMORY ELEMENT AND METHOD OF MANUFACTURING THE SAME

TECHNICAL FIELD

The present invention relates to an electrically rewritable non-volatile memory element and to a method of manufacturing the element. More specifically, the present invention relates to an electrically rewritable non-volatile memory element having a recording layer that includes phase change material, and to a method of manufacturing the element.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabyte. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data, and write and erase times are slow. These drawbacks make flash memory an unsuitable candidate for replacing DRAM in main memory applications. There are other non-volatile memory devices, such as magnetoresistive random access memory (MRAM) and. ferroelectric random access memory (FRAM), but they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless it is heated to a high temperature, so data is retained even when the power supply is switched off.

In order to efficiently heat phase change material using a write current, it is desirable to use a structure that does not readily allow diffuse of the heat generated by the write current. In one structure for achieving, the upper surface of a recording layer is covered with a top electrode having low thermal conductivity to cut down on heat dissipation to a bit line that has a large thermal capacity and high thermal conductivity. See U.S. Pat. No. 5,536,947, "Writing Current Reduction for High-density Phase-change RAM," Y. N. Hwang, S. H. Lee, S. J. Ahn, S. Y. Lee, K. C. Ryoo, H. S. Hong, H. C. Koo, F. Yeung, J. H. Oh, H. J. Kim, W. C. Jeong, J. H. Park, H. Horii, Y. H. Ha, J. H. Yi, G. H. Hoh, G. T. Jeong, H. S. Jeong, and Kinam Kim," IEEE 2003, and "An Edge Contact Type Cell for Phase Change RAM Featuring Very Low Power Consumption," Y. H. Ha, J. H. Yi, H. Horii, J. H. Park, S. H. Joo, S. O. Park, U-In Chung, and J. T. Moon, 2003 Symposium on VLSI Technology Digest of Technical Papers.

However, because in the structure described in above literary documents the planar recording layer is sandwiched between a top electrode and a bottom electrode, the thickness of the recording layer has to be greatly increased to provide a sufficient decrease in the dissipation of heat to the bit line. Increasing the thickness of the recording layer means it takes longer to form the layer, in addition to which it takes a stronger electric field to induce the phase change, especially the change from a high resistance state to a low resistance state. Since the voltage for inducing the phase change therefore has to be increased, so the structure is not one that is suitable for achieving low-voltage devices.

Thus, it is difficult to adequately raise heating efficiency with devices having a conventional structure. This makes it difficult to reduce write current, and also makes it difficult to speed up write operations.

SUMMARY OF THE INVENTION

It is therefore an object of the present invention to provide an improved electrically rewritable non-volatile memory element having a recording layer that contains phase change material, and a method for manufacturing the memory element.

Another object of the invention is to provide an electrically rewritable non-volatile memory element with high heating efficiency having a recording layer that contains phase change material, and a method for manufacturing the memory element.

The above and other objects of the present invention can be accomplished by a non-volatile memory element comprising a bottom electrode, a top electrode provided on the bottom electrode, and a recording layer containing phase change material connected between the bottom electrode and the top electrode, wherein the top electrode is in contact with a growth initiation surface of the recording layer.

Thus, the memory element of this invention has a structure in which the top electrode is in contact with the growth initiation surface of the recording layer. This structure can be obtained by forming the top electrode before the recording layer, resulting in a three-dimensional structure unlike that of the prior art. This decreases heat dissipation to the bit line without increasing the thickness of the recording layer.

Preferably, the memory element further comprises a bit line connected to the top electrode and an interlayer insulation layer provided between the bottom electrode and the bit line, with at least part of the top electrode being formed in a through-hole provided in the interlayer insulation layer. This makes it possible to readily form the recording layer as a three-dimensional structure.

A structure may be used in which the bit line has an etched surface formed by patterning that is in contact with a growth initiation surface of the top electrode. In this case, preferably the memory element further comprises a second etching stopper provided on the bit line, and the through-hole passes through the interlayer insulation layer, the bit line and the second etching stopper.

The memory element can further comprise insulation material buried in the through-hole, with the bit line being formed on the insulation material.

The above and other objects of the present invention can also be accomplished by a non-volatile memory element comprising a bottom electrode, a top electrode provided on the bottom electrode, and a recording layer containing phase change material connected between the bottom electrode and the top electrode, wherein the top electrode is in contact with at least a side surface of the recording layer.

This structure can also be obtained by forming the top electrode before the recording layer, resulting in a three-dimensional structure that is unlike that of the prior art, which reduces the amount of heat radiated at the bit line. In this case, it is preferable for the recording layer to be in contact with at least a side surface of the top electrode.

The above and other objects of the present invention can also be accomplished by a non-volatile memory element comprising a bottom electrode, a top electrode provided on the bottom electrode, a recording layer containing phase change material connected between the bottom electrode and the top electrode, and a bit line connected to the top electrode, wherein the bit line has an etched surface formed by patterning, and said etched surface is in contact with a growth initiation surface of the top electrode.

This structure can also be obtained by forming the top electrode before the recording layer, resulting in a three-dimensional structure that is unlike that of the prior art, which reduces the amount of heat radiated at the bit line.

The above and other objects of the present invention can also be accomplished by a method of manufacturing a non-volatile memory element comprising a first step for forming a bottom electrode, a second step for forming an etching stopper and an interlayer insulation layer, in that order, on the bottom electrode, a third step for exposing a portion of the etching stopper by forming a through-hole in the interlayer insulation layer, a fourth step for forming a top electrode on at least a side surface of the through-hole, a fifth step for exposing at least a portion of the bottom electrode by forming an opening in the etching stopper exposed at a bottom part of the through-hole, and a sixth step for forming a recording layer containing phase change material in the through-hole in contact with the bottom electrode and the top electrode.

In accordance with this aspect of the present invention, the top electrode is formed before the recording layer, and the recording layer is formed in the through-hole, resulting in a three-dimensional structure having high heating efficiency.

As described above, an electrically rewritable non-volatile memory element having improved heating efficiency, and a method of manufacturing the element can be provided. Therefore, not only a write current can be decreased but also a writing speed can be enhanced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
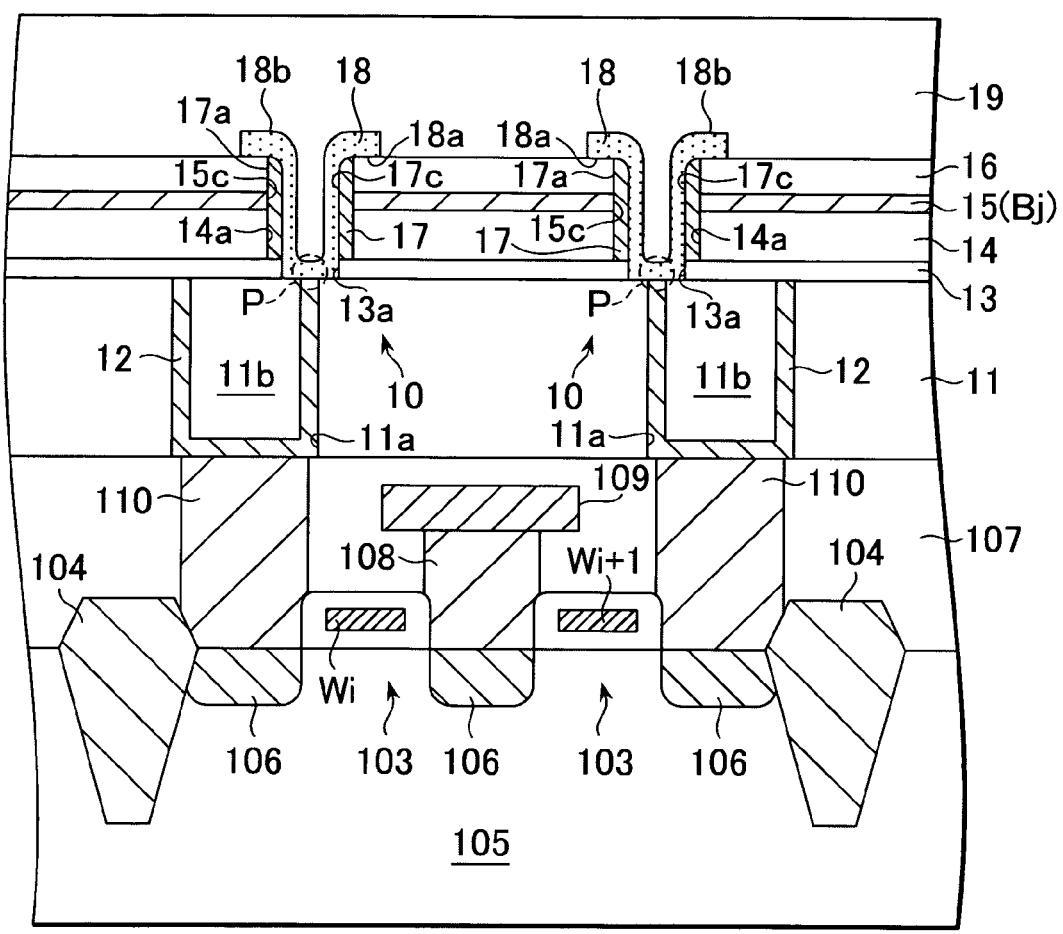
FIG. 1 is a cross-sectional view of the structure of a memory cell using the non-volatile memory element according to a first embodiment of the present invention.
Figure 2:
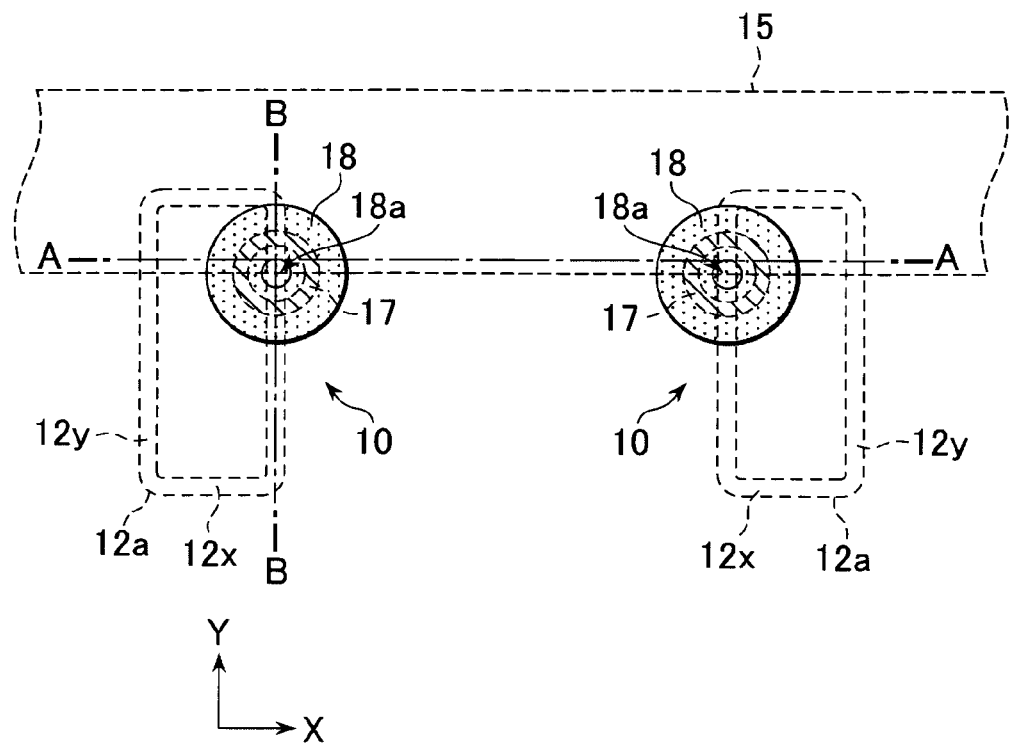
FIG. 2 is a plan view of the memory element according to a first embodiment of the present invention.
Figure 3:
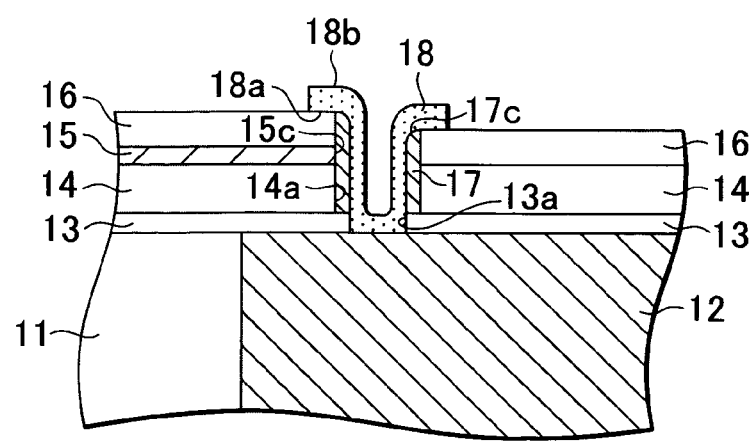
FIG. 3 is a cross-sectional view along the line B-B shown in FIG. 2.

FIG. 1 is a cross-sectional view of the structure of a memory cell using the non-volatile memory element 10 according to a first embodiment of the present invention. FIG. 2 is a plan view of the memory element 10. A cross-sectional view along the line A-A shown in FIG. 2 is shown in FIG. 1. FIG. 3 is a cross-sectional view along the line B-B shown in FIG. 2.

With reference to FIG. 1, the non-volatile memory element 10 according to this embodiment of the present invention includes an interlayer insulation layer 11, a bottom electrode 12 buried in the interlayer insulation layer 11, a first etching stopper 13, interlayer insulation layer 14, bit line 15 and second etching stopper 16 formed in that order on the bottom electrode 12, a top electrode 17 provided on the inside wall of a through-hole 14a, and a recording layer 18 in contact with the bottom electrode 12 and the top electrode 17.

A material such as silicon oxide or silicon nitride can be used for the interlayer insulation layers 11 and 14 and the etching stoppers 13 and 16. The materials used for the interlayer insulation layer 14 and the first etching stopper 13 have to have different etching rates, and the materials used for the first etching stopper 13 and the second etching stopper 16 also have to have different etching rates. It is also preferable, but not an essential requirement, for the materials used for the interlayer insulation layer 11 and the first etching stopper 13 to also have different etching rates. If, for example, the interlayer insulation layers 11 and 14 and the second etching stopper 16 are formed using silicon oxide, it is preferable to use silicon nitride for the first etching stopper 13.

The bottom electrode 12 is formed in the shape of a cylinder around the inside wall of a through-hole 11a formed in the interlayer insulation layer 11. Thus, as shown in FIG. 2, the upper surface 12a of the bottom electrode 12 is ring-shaped. The region defined by the bottom electrode 12 is filled with insulation material 11b, which preferably is the same material as that of the interlayer insulation layer 11.

As shown in FIG. 2, the upper surface 12a of the bottom electrode 12 has a strip-shaped region 12x that extends in the X direction, and a strip-shaped region 12y that extends in the Y direction. In this embodiment, the strip-shaped region 12y is longer than the strip-shaped region 12x.

The bottom electrode 12 is used as a heater plug, constituting part of the heater during data writes. For this, the bottom electrode 12 is preferably formed of a material having a relatively high electrical resistance, such as metal silicides, metal nitrides and nitrides of metal silicides. These include, but are not limited to, TiAlN, TiSiN, TiCN and other such materials.

The first etching stopper 13 is provided with an opening 13a arranged at a location that exposes a strip-shaped region 12y of the bottom electrode 12. The opening 13a is filled by the recording layer 18, so that at the bottom of the opening 13a, the recording layer 18 is in contact with the strip-shaped region 12y. The opening 13a is provided in opposition to the strip-shaped region 12y to reduce variation in the area of contact between the recording layer 18 and the bottom electrode 12.

Figure 4A:
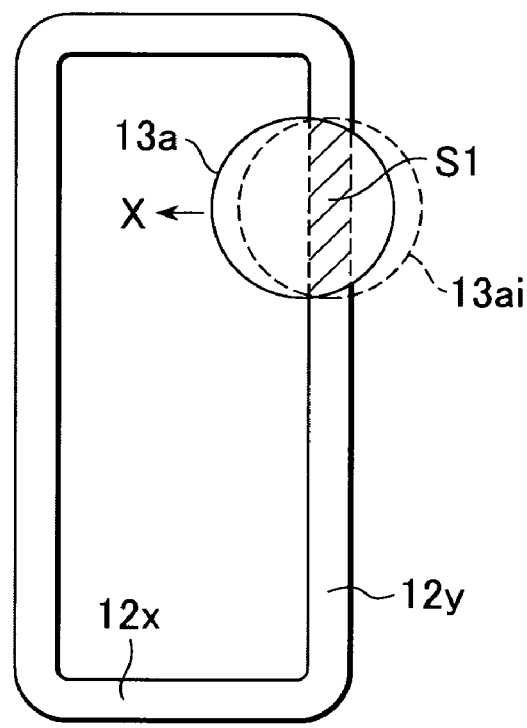
FIG. 4A is a drawing for explaining the effect produced by the position of the opening deviating in the X direction from the design position.
Figure 4B:
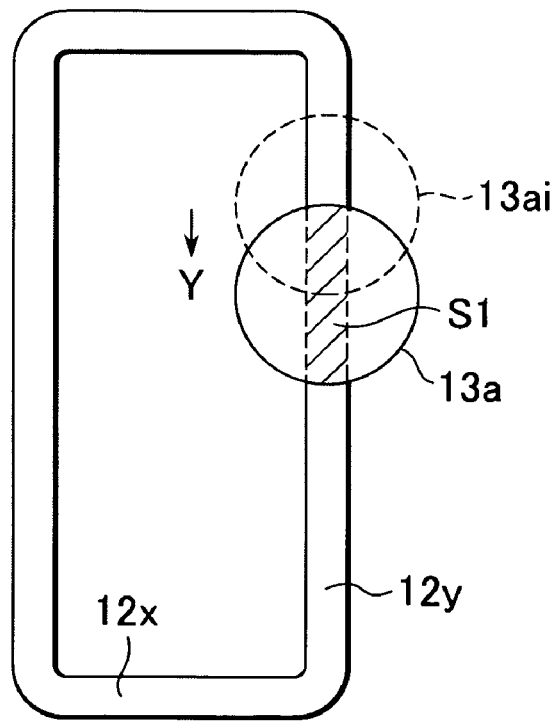
FIG. 4B is a drawing for explaining the effect produced by the position of the opening deviating in the Y direction from the design position.

Specifically, as shown in FIG. 4A, locating the opening 13a so that the strip-shaped region 12y is exposed makes it harder for variation to arise in the area S1 of the exposed strip-shaped region 12y, even if the actual location of the opening 13a deviates from the design position 13ai in the X direction, or in the Y direction, as shown in FIG. 4B. To a certain extent, the same effect is also obtained when the opening 13a is located in opposition to the strip-shaped region 12x. However, with respect to deviation, variation in the area S1 can be reduced more by locating the opening 13a in opposition to the longer strip-shaped region 12y.

A stacked body comprised of the interlayer insulation layer 14, bit line 15 and second etching stopper 16 is provided in the through-hole 14a. The top electrode 17 is formed on the inside wall of the through-hole 14a. This can be done by forming the top electrode 17 over the whole surface and then etching it back, as described below. The opening 13a is formed in a bottom portion of the through-hole 14a not covered by the top electrode 17.

The top electrode 17 is preferably made of a material having a relatively low thermal conductivity so that heat generated by the heating current cannot easily diffuse. Specific examples are TiAlN, TiSiN, TiCN, as in the case of the bottom electrode 12.

The recording layer 18 is provided at the inside part of the through-hole 14a in which the inside wall therefore is covered with the top electrode 17. The recording layer 18 is in contact with the strip-shaped region 12y of the bottom electrode 12 exposed by the opening 13a, and is also in contact with the inside wall of the cylindrical top electrode 17. Accordingly, the top electrode 17 is in contact with the growth initiation surface 18a of the recording layer 18.

The recording layer 18 is formed of phase change material. While the phase change material is not particularly limited and may be any material that takes two or more states and in which each state has a different electrical resistance, it is preferable to choose a chalcogenide material. Chalcogenide material means an alloy containing one or more elements such as germanium, antimony, tellurium, indium, and selenium. Examples include binary system alloys such as GaSb, InSb, InSe, $Sb_2Te_3$, and GeTe; ternary system alloys such as $Ge_2Sb_2Te_5$, InSbTe, GaSeTe, $SnSb_2Te_4$, and InSbGe; and quaternary system alloys such as AgInSbTe, (GeSn)SbTe, GeSb (SeTe), and $Te_{81}Ge1_{15}Sb_2S_2$.

The phase change material containing the chalcogenide material can take an amorphous state or a crystalline state. In the amorphous state the resistance is relatively high, and in the crystalline state the resistance is relatively low.

Figure 5:
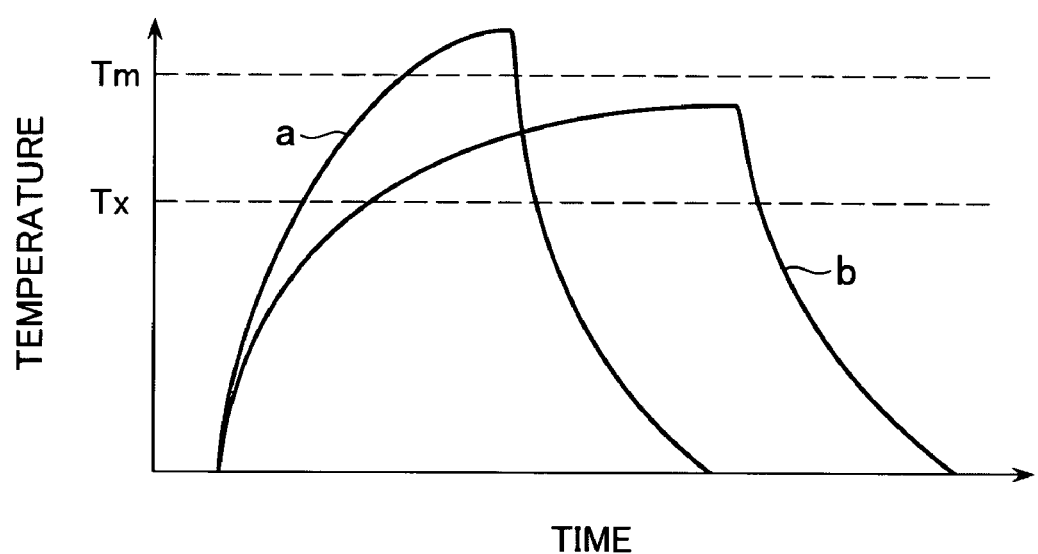
FIG. 5 is a graph for explaining the method of controlling the phase state of phase change material containing chalcogenide material.

FIG. 5 is a graph for explaining the method of controlling the phase state of phase change material containing chalcogenide material.

The phase change material is changed to the amorphous state by heating it to or above the melting temperature Tm and then cooling it, as shown by the curve a in FIG. 5. To change the material to the crystalline state, it is heated to a temperature that is at least as high as the crystallization temperature Tx and below the melting temperature Tm, as shown by curve b in FIG. 5. The heating temperature is controlled by controlling the duration and the amount of current per unit time that is passed through the material during the heating.

When the recording layer 18 is subjected to a write current, the region of contact between the recording layer 18 and the bottom electrode 12 becomes a heating region P. That is, the phase state of the chalcogenide material in the vicinity of the heating region P can be switched by applying a write current to the recording layer 18. Doing this changes the electrical resistance, between the top electrode 17 and the bottom electrode 12.

As shown in FIG. 1, the recording layer 18 is provided in the through-hole 14a, and the top electrode 17 is formed on the inside wall of the through-hole 14a. Therefore, the growth initiation surface 18a is in contact with the etched surface 17c of the top electrode 17 formed by the etch-back process. Accordingly, there is contact between the inner sidewall of the cylindrical top electrode 17 and the sidewall of the recording layer 18.

There is no particular limitation on the thickness of the recording layer 18. In this embodiment, as an example, the recording layer 18 is given a thickness that does not completely fill the through-hole 14a. However, a thickness may be used that does completely fill the through-hole 14a. In this embodiment, in addition to being provided inside the through-hole 14a, part of the recording layer 18 is provided outside the through-hole 14a.

The bit line 15 is provided on the interlayer insulation layer 14, in contact with the sidewall of the top electrode 17. Specifically, an etched surface 15c of the bit line 15 is in contact with the growth initiation surface 17a of the top electrode 17. Accordingly, there is contact between the outer sidewall of the cylindrical top electrode 17 and the sidewall of the bit line 15.

For the bit line 15, a metallic material is chosen that has low electrical resistance. Examples include aluminum (Al), titanium (Ti), and tungsten (W), or alloys, nitrides or silicides thereof. Specific examples that can be cited include W, WN and TiN. Generally, a metallic material that has a low resistance has a high thermal conductivity, and also, since the bit line 15 has a large thermal capacity, contact with the top electrode 17 in the vicinity of the heating region P causes heat to readily diffuse to the bit line 15, degrading the heating efficiency. However, because in the case of the memory element 10 the recording layer 18 has a three-dimensional structure, it is possible to increase the distance between the heating region P and the bit line 15, without increasing the thickness of the recording layer 18.

The second etching stopper 16 is provided on the bit line 15. As shown in FIG. 3, the second etching stopper 16 is also provided on a region where there is no bit line 15. An insulation layer 19 is provided on the second etching stopper 16. All of the growth termination surface 18b of the recording layer 18 is covered by the insulation layer 19 (or by the protective insulation layer 19a described below).

The non-volatile memory element 10 thus constituted can be formed on a semiconductor substrate in the form of a matrix to constitute an electrically rewritable non-volatile memory device.

Figure 6:
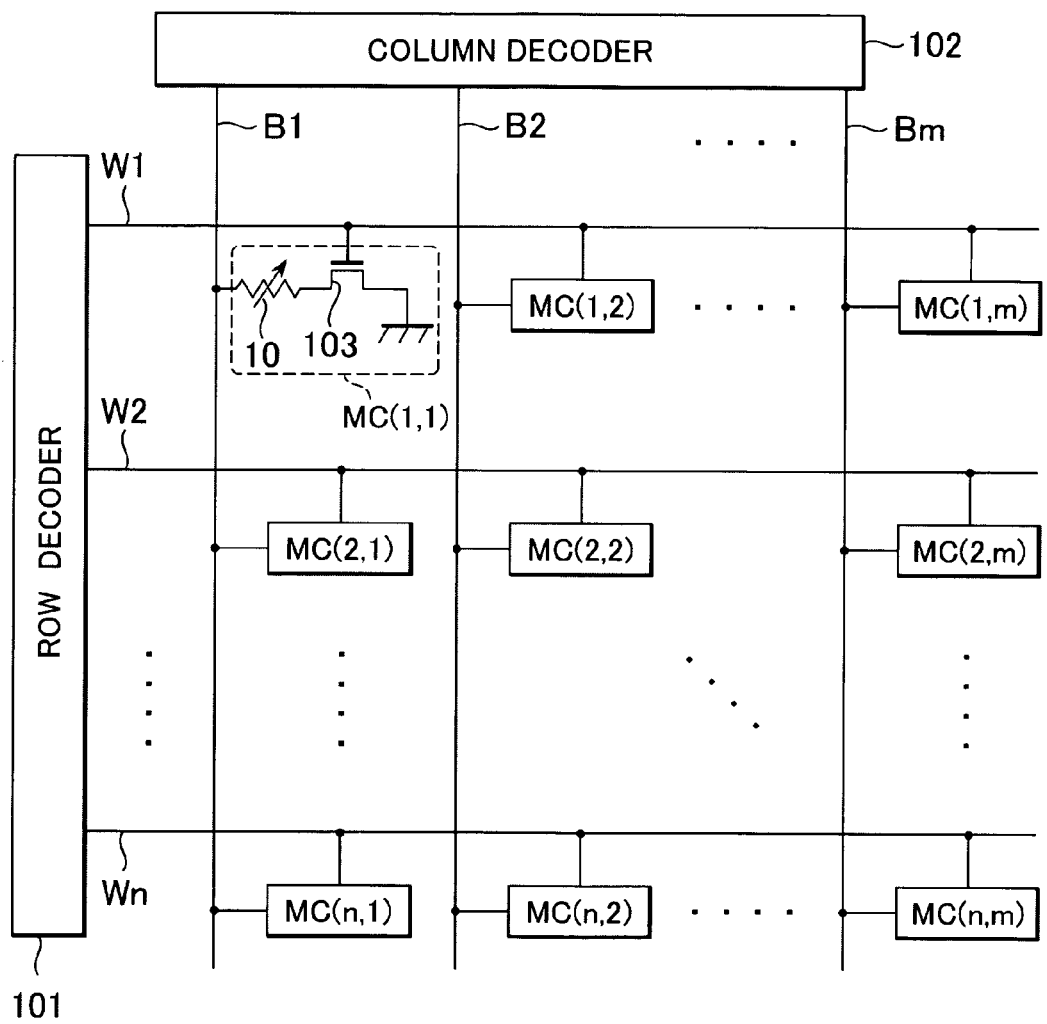
FIG. 6 is a circuit diagram of a non-volatile semiconductor memory device having a matrix configuration of n lines by m rows.

FIG. 6 is a circuit diagram of a non-volatile memory device configured as a matrix of n rows and m columns.

The non-volatile memory device shown in FIG. 6 has n word lines W1 to Wn, m bit lines B1 to Bm, and memory cells MC (1, 1) to MC (n, m), each located at an intersection of a word line and bit line. The word lines W1 to Wn are connected to a row decoder 101, and the bit lines B1 to Bm are connected to a column decoder 102. Each memory cell MC consists of a memory element 10 and transistor 103 connected in series between the corresponding bit line and ground. The control terminal of transistor 103 is connected to the corresponding word line.

The structure of the memory element 10 is as has been described with reference to FIG. 1. Thus, the bottom electrode 12 is connected to a corresponding transistor 103.

The structure of each of the memory cells MC used by the memory element 10 is as shown in FIG. 1, which shows two memory cells MC (i, j) and MC (i+1, j) sharing a common bit line Bj (15).

As shown in FIG. 1, word lines Wi and Wi+1 are connected to the gate electrode of the transistor 103. The active region 105, which is defined by element isolation regions 104, comprises three diffusion regions 106, whereby two transistors 103 are formed in a single active region 105. The two transistors 103 share a common source that is connected to the ground line 109 via a contact plug 108 in the interlayer insulation layer 107. The drain of each transistor 103 is connected to the bottom electrode 12 of the corresponding memory element 10 via a contact plug 110. The top electrode 17 of each of the two memory elements 10 is connected to a common bit line Bj.

In the non-volatile semiconductor memory device thus constituted, data reads and writes can be carried out by using the row decoder 101 to activate one of the word lines W1 to Wn, and then passing a current through at least one of the bit lines B1 to Bm. That is, the transistors 103 are switched on in the memory cells of the activated word line, connecting the corresponding bit lines to ground via the memory element 10. In this state, phase changes can be effected in the recording layer 18 by passing write current through the bit lines selected by the column decoder 102.

Specifically, when a prescribed amount of current is used to raise the temperature of the phase change material of the recording layer 18 to at least the melting temperature Tm, shown in FIG. 5, and the current is then abruptly switched off, the rapid cooling that ensures switches the material into the amorphous phase. When an amount of current that is less than the prescribed amount is used to heat the phase change material of the recording layer 18 to a temperature that is at least as high as the crystallization temperature Tx shown in FIG. 5 but lower than the melting temperature Tm, and the current is then gradually reduced, the gradual cooling thus produced promotes crystal growth, switching the material to the crystalline phase.

Data can be read by using the row decoder 101 to activate one of the word lines W1 to Wn and then passing a read current through at least one of the bit lines B1 to Bm. A memory cell MC in which the recording layer 18 is in the amorphous phase has a high resistance and a memory cell MC in which the recording layer 18 is in the crystalline phase has a low resistance, so the phase state of the recording layer 18 can be known by using a sense amplifier (not shown) to detect this.

Phase states of the recording layer 18 can be associated with stored logical values. If an amorphous phase state is defined as "0" and a crystalline phase state as "1", for example, one binary bit of information can be stored in a single memory cell. Also, when moving from the amorphous phase to the crystalline phase, the crystallization ratio can be controlled in multiple levels or linearly by adjusting the time the recording layer 18 is held at a temperature that is not lower than the crystallization temperature Tx and lower than the melting temperature Tm. With multilevel control of the ratio between the amorphous phase and the crystalline phase, two or more bits of data can be stored in a single memory cell, while with linear control, information can be stored as analog data.

The method of manufacturing the non-volatile memory element 10 will now be described.

FIGS. 7A, 8A, 9A and 10A are plan views illustrating the process of manufacturing the memory element 10. FIGS. 7B and 7C are cross-sectional views along lines C-C and D-D, respectively, of FIG. 7A; FIGS. 8B and 8C are cross-sectional views along lines E-E and F-F, respectively, of FIG. 8A; FIGS. 9B and 9C are cross-sectional views along lines G-G and H-H, respectively, of FIG. 9A; and FIGS. 10B and 10C are cross-sectional views along lines I-I and J-J, respectively, of FIG. 10A. To facilitate understanding of the drawings, in each case the portion relating to transistor 103 has been omitted.

Figure 7A:
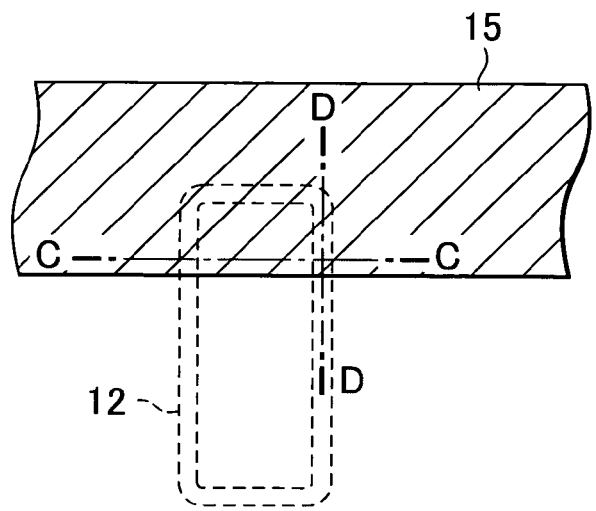
FIG. 7A is plan views illustrating the process of manufacturing the memory element according to a first embodiment of the present invention.
Figure 7B:
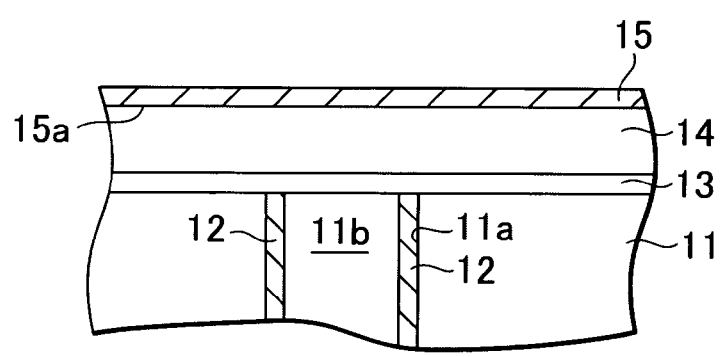
FIG. 7B is a cross-sectional view along the line C-C shown in FIG. 7A.
Figure 7C:
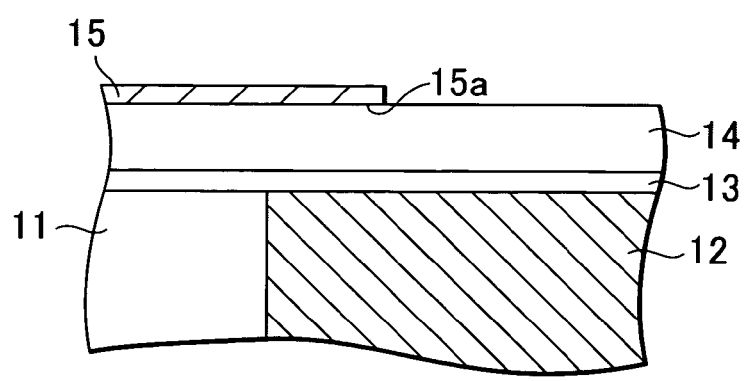
FIG. 7C is a cross-sectional view along the line D-D shown in FIG. 7A.

First, with reference to FIGS. 7A to 7C, after the cylindrical bottom electrode 12 is formed and the region thus defined is filled with the insulation material 11b, the first etching stopper 13, the interlayer insulation layer 14 and bit line 15 are formed, in that order. After the through-hole 11a has been formed in the interlayer insulation layer 11, a film growth method having good step coverage is used to form the bottom electrode 12 on the inside wall of the through-hole 11a, and the region thus defined by the bottom electrode 12 is filled with the insulation material 11b. Then, CMP is used to remove the portions of the insulation material 11b and bottom electrode 12 that are not required. CVD is a method providing good step coverage that can be used.

The bit line 15 is formed by forming the selected metallic material on the interlayer insulation layer 14, and then patterning it. As a result, growth initiation surface 15a of the bit line 15 is in contact with the whole of the interlayer insulation layer 14. As shown in FIG. 7A, viewed from above, preferably the bit line 15 is patterned so that the end part in the width direction intersects the strip-shaped region 12y of the bottom electrode 12.

Figure 8A:
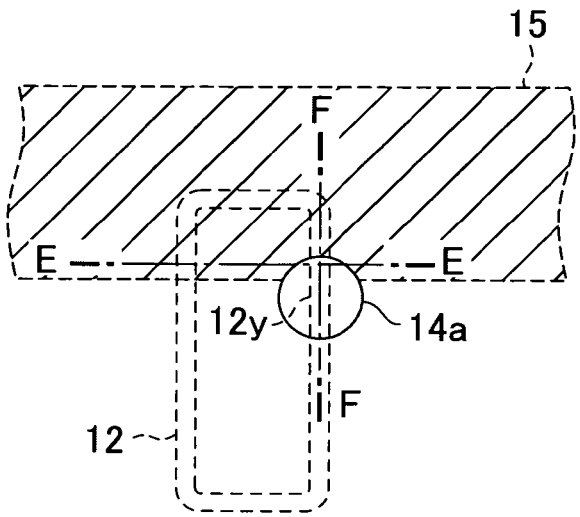
FIG. 8A is plan views illustrating the process of manufacturing the memory element according to a first embodiment of the present invention.
Figure 8B:
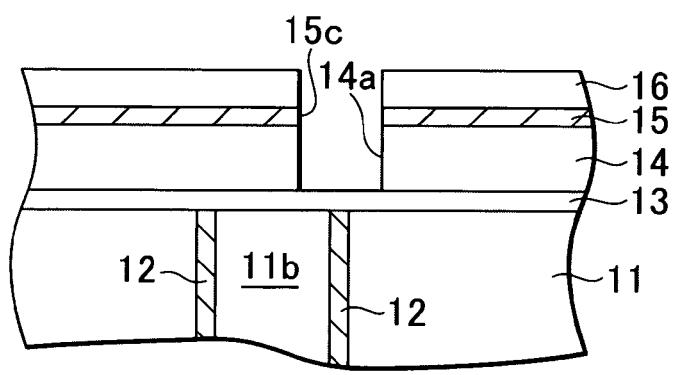
FIG. 8B is a cross-sectional view along the line E-E shown in FIG. 8A.
Figure 8C:
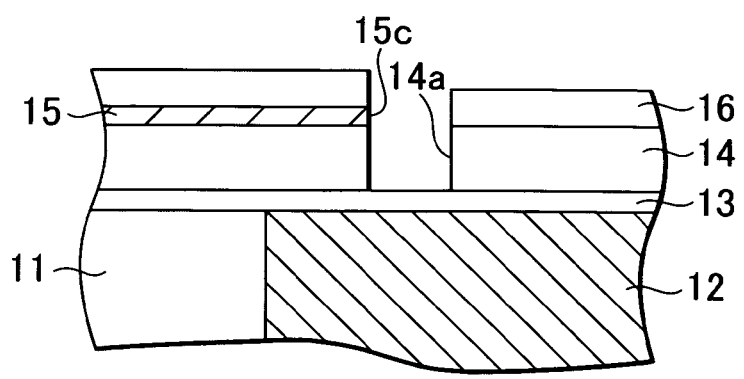
FIG. 8C is a cross-sectional view along the line F-F shown in FIG. 8A.

Next, as illustrated by FIGS. 8A to 8C, after the bit line 15 has been covered by the second etching stopper 16, the second etching stopper 16, bit line 15 and interlayer insulation layer 14 are etched to form the through-hole 14a, exposing a portion of the first etching stopper 13 corresponding to the part in opposition to the strip-shaped region 12y of the bottom electrode 12. The through-hole 14a can be formed using photolithography and dry etching. As shown by FIG. 8A, in this embodiment the through-hole 14a is formed at a location that includes a widthwise end portion of the bit line 15.

To prevent the bottom electrode 12 being exposed when the through-hole 14a is being formed, the etching has to be terminated when the bottom electrode 12 is still covered by the first etching stopper 13. In this embodiment, an adequate margin in the etching step is ensured by forming the interlayer insulation layer 14 of a material having a different etching rate from that of the material of the first etching stopper 13. When the through-hole 14a is thus formed, the etched surface 15c produced by etching through the bit line 15 is exposed on the inside wall of the through-hole 14a.

Figure 9A:
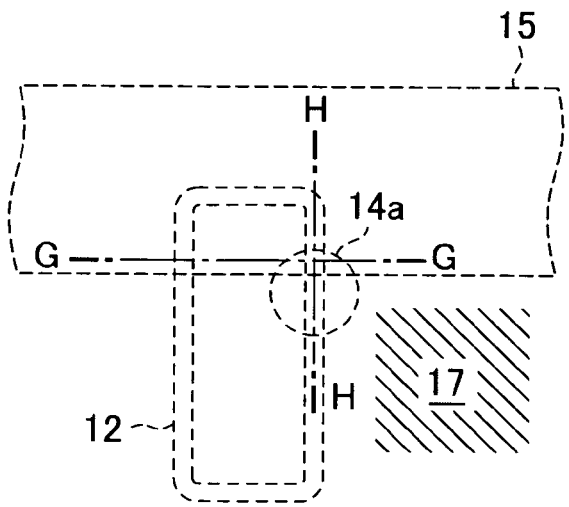
FIG. 9A is plan views illustrating the process of manufacturing the memory element according to a first embodiment of the present invention.
Figure 9B:
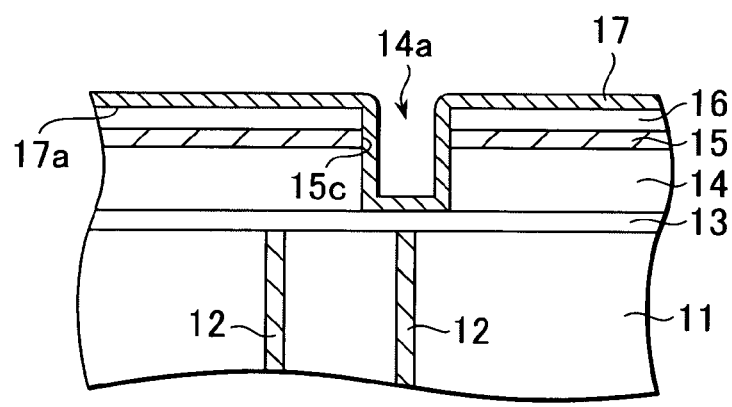
FIG. 9B is a cross-sectional view along the line G-G shown in FIG. 9A.
Figure 9C:
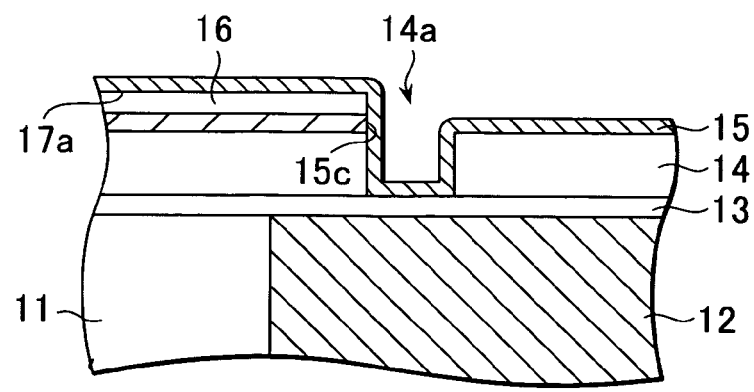
FIG. 9C is a cross-sectional view along the line H-H shown in FIG. 9A.

Next, as shown in FIGS. 9A to 9C, the top electrode 17 is formed over the whole surface, including the inside of the through-hole 14a, thereby covering the etched surface 15c. That is to say, the etched surface 15c and growth initiation surface 17a are thereby brought into a state of contact. Since the bottom of the through-hole 14a is covered by the first etching stopper 13, there is no contact between the top electrode 17 and the bottom electrode 12.

Figure 10A:
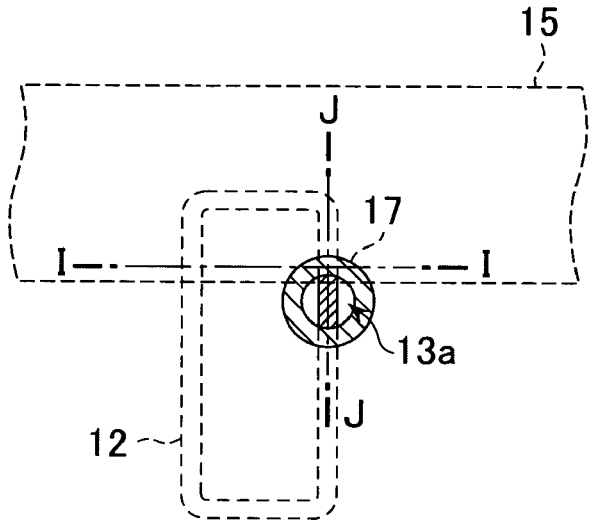
FIG. 10A is plan views illustrating the process of manufacturing the memory element according to a first embodiment of the present invention.
Figure 10B:
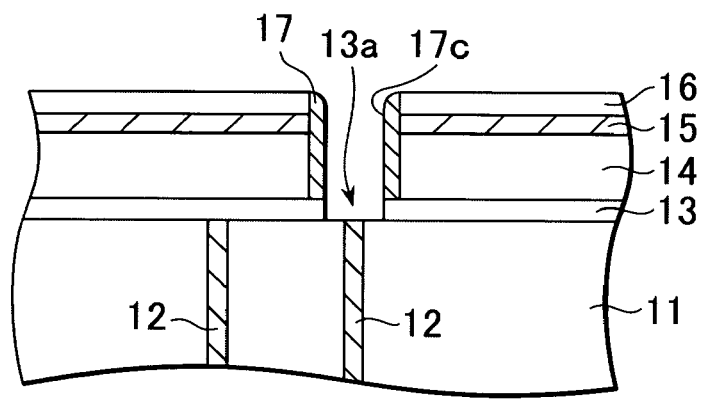
FIG. 10B is a cross-sectional view along the line I-I shown in FIG. 10A.
Figure 10C:
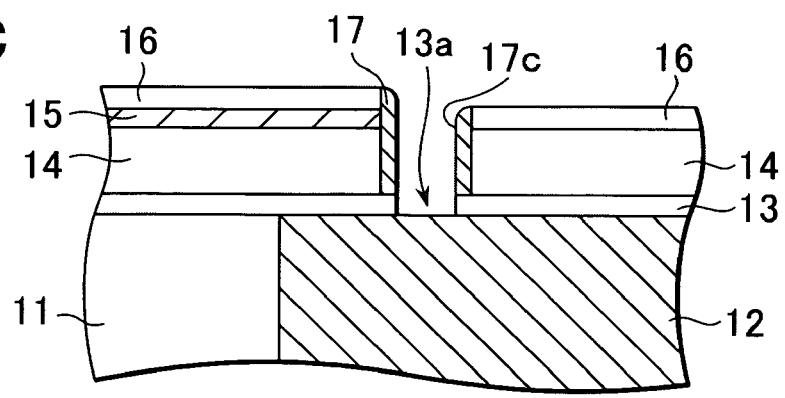
FIG. 10C is a cross-sectional view along the line J-J shown in FIG. 10A.

The top electrode 17 is then etched back, as shown in FIGS. 10A to 10C. This removes the portion of the top electrode 17 on the part of the surface substantially parallel to the substrate, leaving only that portion of the top electrode 17 that is on the inside wall of the through-hole 14a, with the etched surface 17c of the electrode 17c exposed.

Etching the top electrode 17 also re-exposes part of the first etching stopper 13 formed at the bottom of the through-hole 14a. Then, using the remaining portion of the top electrode 17 on the inside wall of the through-hole 14a as a mask, the first etching stopper 13 exposed at the bottom of the through-hole 14a is etched, forming the opening 13a, and thereby exposing a portion of the bottom electrode 12.

Since in the case of this embodiment the materials used for the first etching stopper 13 and the second etching stopper 16 have different etching rates, this step does not produce much of a decrease in the thickness of the second etching stopper 16. Over-etching of the interlayer insulation layer 11 and insulation material 11b occurring during the formation of the opening 13a can be decreased by forming the interlayer insulation layer 11 and insulation material 11b of a material having a different etching rate from that of the material of the first etching stopper 13.

Next, as shown in FIGS. 1 to 3, after the recording layer 18, constituted by chalcogenide material, is formed over the whole surface, including inside the opening 13a and through-hole 14a, and patterning is used to remove the portion that is not required, the insulation layer 19 is formed over the whole surface, thereby completing the memory element 10. There is no particular limitation on the method used to form the recording layer 18. Sputtering or CVD, for example, may be used. In this way, by forming the top electrode 17 before the recording layer 18, contact is effected between the etched surface 17c constituting the side surface of the top electrode 17, and the growth initiation surface 18a constituting the side surface of the recording layer 18.

The second etching stopper 16 covers the whole of the upper surface (growth termination surface) of the bit line 15, and functions as an etching stop when the recording layer 18 is being patterned. The bit line 15 is therefore not exposed to the etching atmosphere, which, by preventing the bit line 15 from being decreased in thickness, ensures the bit line has the prescribed resistance.

Figure 11:
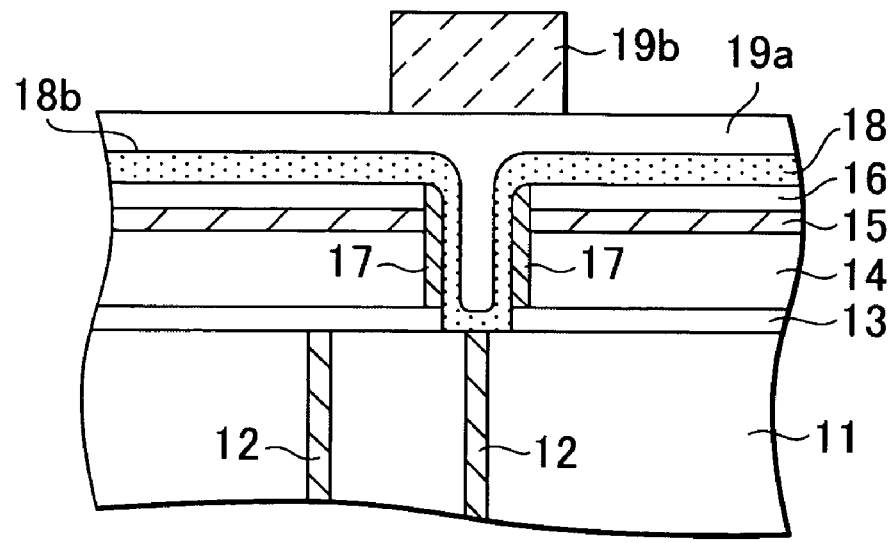
FIGS. 11 and 12 are drawings for explaining the method of patterning the recording layer via the protective insulation layer.
Figure 12:
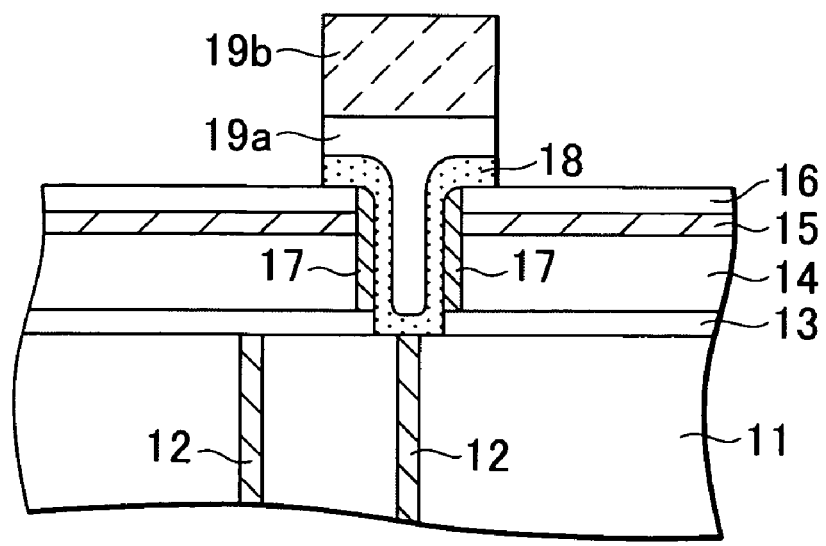

Preferably, as shown in FIG. 11, the patterning of the recording layer 18 is carried out with a protective insulation layer 19a formed over the whole of the upper surface (growth termination surface 18b) of the recording layer 18, and a photoresist 19b formed on the protective insulation layer 19a. After completion of the patterning, as shown in FIG. 12, this makes it possible to protect the recording layer 18 from damage when ashing is used to remove the photoresist.

In this way, in accordance with this embodiment, the recording layer 18 has a three-dimensional structure formed in the opening 13a and the through-hole 14a. Moreover, as the bit line 15 is formed before the recording layer 18, there is no forming of the bit line 15 in the through-hole 14a. In addition, with the top electrode 17 being formed on the inside wall of the through-hole 14a, the sidewalls of the top electrode 17 and bit line 15 are in mutual contact. This all ensures that there is enough of a distance between the heating region P and the bit line 15, and also makes it possible to reduce the contact area between the top electrode 17 and the bit line 15. This reduces the amount of heat radiated at the bit line 15, thereby providing higher heating efficiency. Furthermore, since the top electrode 17, which has a low thermal conductivity, is provided between the bit line 15 and the recording layer 18, a material having a low electrical resistance, such as aluminum (Al), titanium (Ti) or tungsten (W), can be used as the material of the bit line 15.

Moreover, with the first etching stopper 13 being provided between the bottom electrode 12 and the interlayer insulation layer 14, the recording layer 18 can be disposed between the electrodes 12 and 17 with no direct contact between the electrodes 12 and 15.

Figure 13:
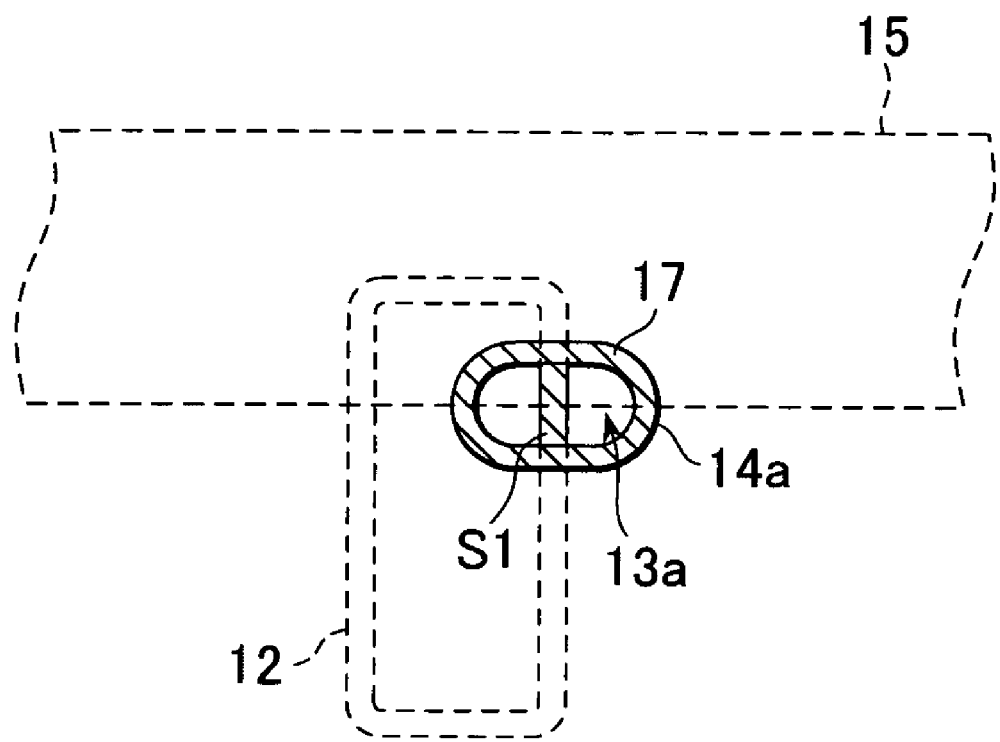
FIG. 13 is a plan view of an example of the memory element in which the planar shape of the opening and through-hole are elongated in the X direction.

Although the plane shape of the opening 13a and the through-hole 14a is substantially circular, it can instead be an elongated shape that extends in the X direction orthogonally to the long side constituted by the strip-shaped region 12y. That is, as shown in FIG. 13, if the plane shape of the opening 13a and through-hole 14a is an elongated one that extends in the X direction, the margin in the X direction can be increased without any increase in the contact area S1 between the recording layer 18 and the bottom electrode 12.

Instead of patterning the recording layer 18, the whole surface may be etched back to leave just the portion of the recording layer 18 that is on the inside wall of the opening 13a and the through-hole 14a.

Figure 14A:
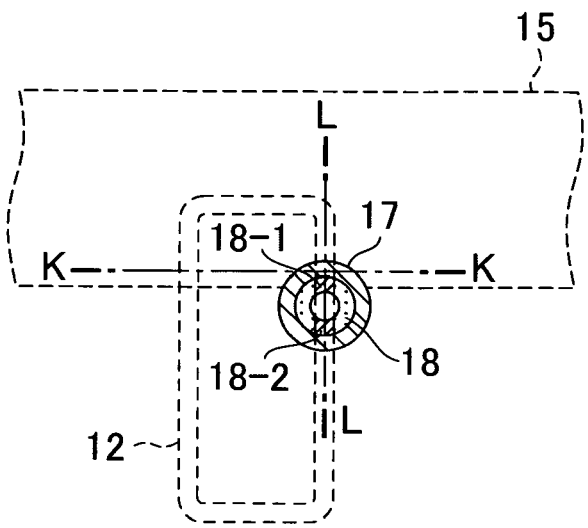
FIG. 14A is a plan view of an example of the memory element in which all that is left of the recording layer is the portion on the inside wall of opening and the through-hole.
Figure 14B:
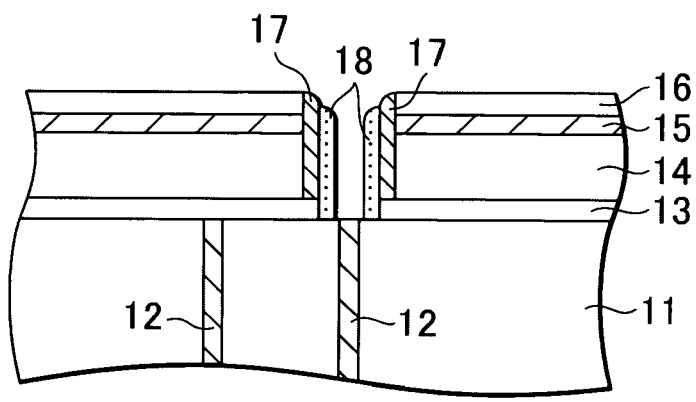
FIG. 14B is a cross-sectional view along the line K-K shown in FIG. 14A.
Figure 14C:
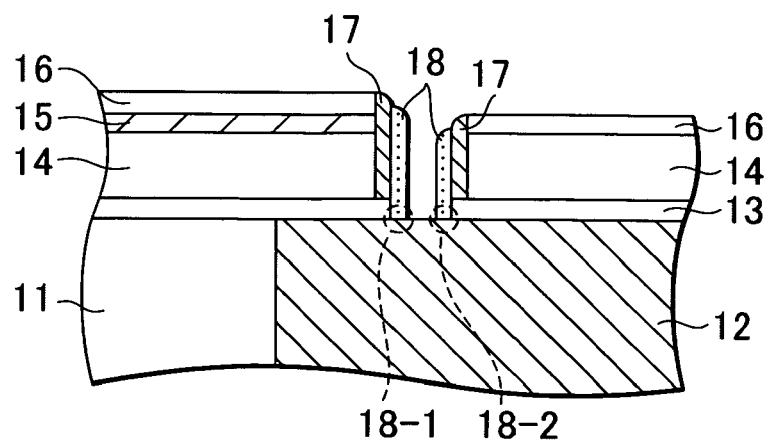
FIG. 14C is a cross-sectional view along the line L-L shown in FIG. 14A.

FIG. 14A is a plan view of an example in which only the part of the recording layer 18 on the inside wall of the opening 13a and through-hole 14a is left. FIGS. 14B and 14C are cross-sectional views along lines K-K and L-L, respectively, shown in FIG. 14A.

As shown in FIGS. 14A to 14C, etching the whole surface of the recording layer 18, so that even the portion at the bottom of the opening 13a is removed, gives the recording layer 18 a ring-shaped lower surface. This increases the heating efficiency by reducing the contact area between the recording layer 18 and the bottom electrode 12. Also, although there are two contact points between the recording layer 18 and the bottom electrode 12, forming two current conduction paths in the recording layer 18, contact region 18-1 is so much closer to the bit line 15 than contact region 18-2 that the current flowing via the contact region 18-2 can be considered negligible.

A non-volatile memory element 20 according to a second embodiment of the present invention will now be described.

Figure 15:
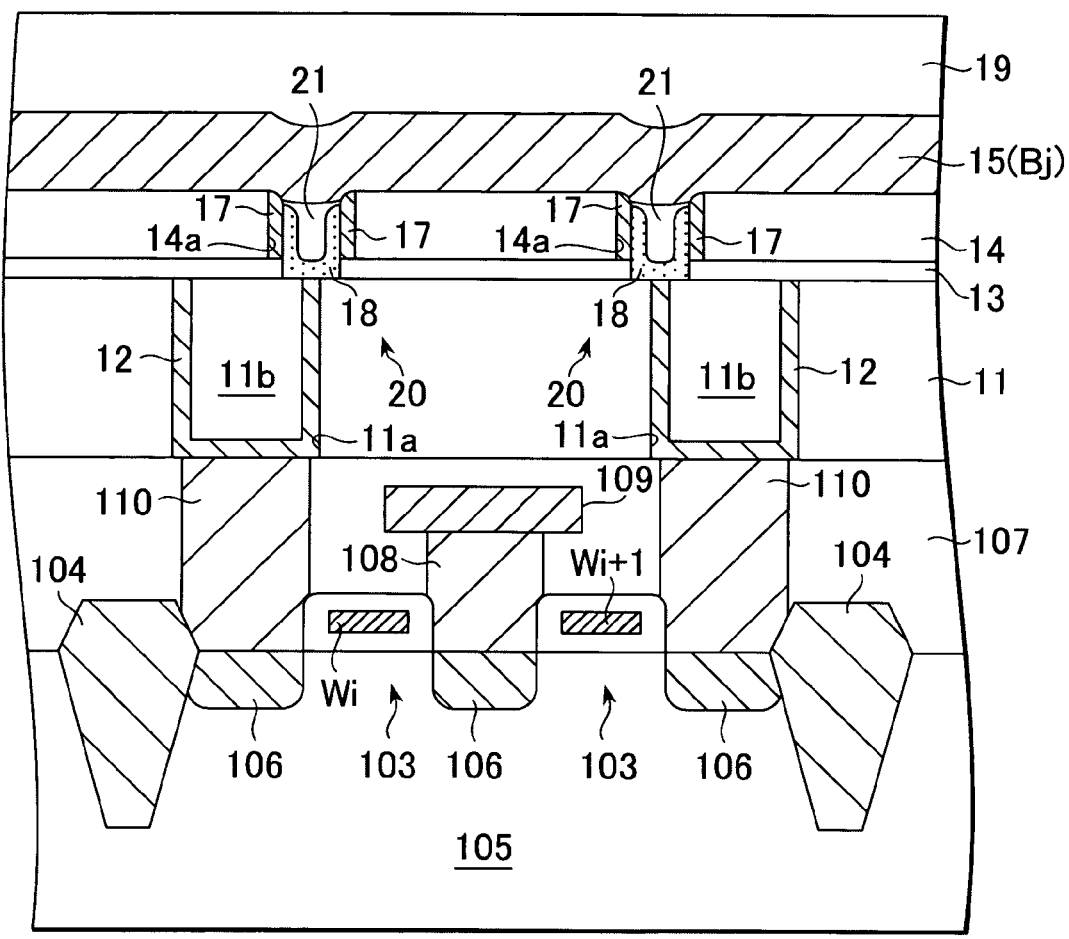
FIG. 15 is a cross-sectional view of the structure of a memory cell using the non-volatile memory element according to a second embodiment of the present invention.

FIG. 15 is a cross-sectional view of the structure of a memory cell using the non-volatile memory element 20 of this embodiment.

As shown in FIG. 15, the memory element 20 of this embodiment differs from the memory element 10 of the first embodiment shown in FIG. 1 in that it has no second etching stopper 16, the bit line 15 is provided over the through-hole 14a, and the through-hole 14a is filled with. insulation material 21. Other parts are the same as those of the memory element 10 and are denoted using the same symbols, so further explanation thereof is omitted.

Since in this embodiment the bit line 15 is provided over the through-hole 14a, the bit line 15 and top electrode 17 are connected vertically. Between the bit line 15 and the recording layer 18 is the insulation material 21 that fills the through-hole 14a, so there is no direct contact between the bit line 15 and the recording layer 18.

The method of manufacturing the non-volatile memory element 20 will now be described.

Figure 16A:
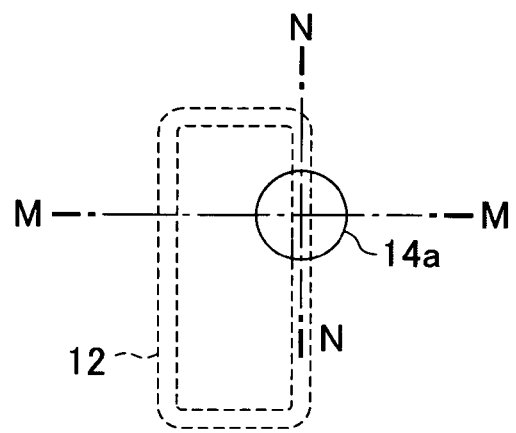
FIG. 16A is plan views illustrating the process of manufacturing the memory element according to a second embodiment of the present invention.
Figure 16B:
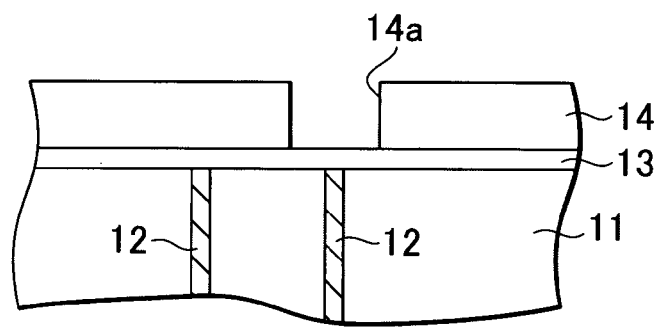
FIG. 16B is a cross-sectional view along the line M-M shown in FIG. 16A.
Figure 16C:
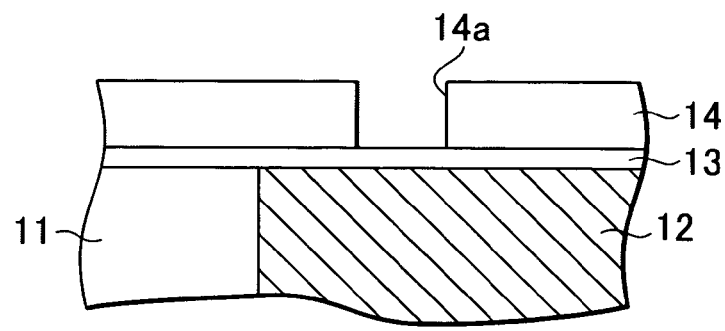
FIG. 16C is a cross-sectional view along the line N-N shown in FIG. 16A.
Figure 17A:
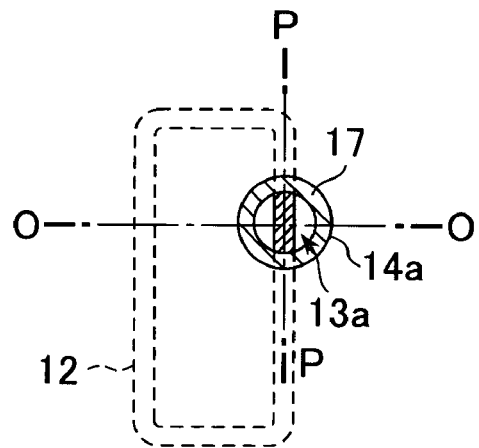
FIG. 17A is plan views illustrating the process of manufacturing the memory element according to a second embodiment of the present invention.
Figure 17B:
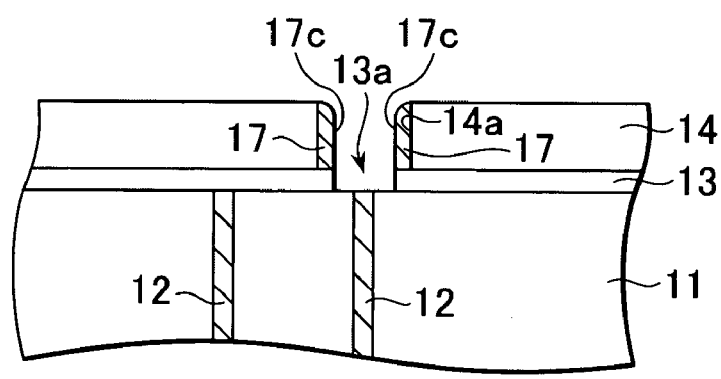
FIG. 17B is a cross-sectional view along the line O-O shown in FIG. 17A.
Figure 17C:
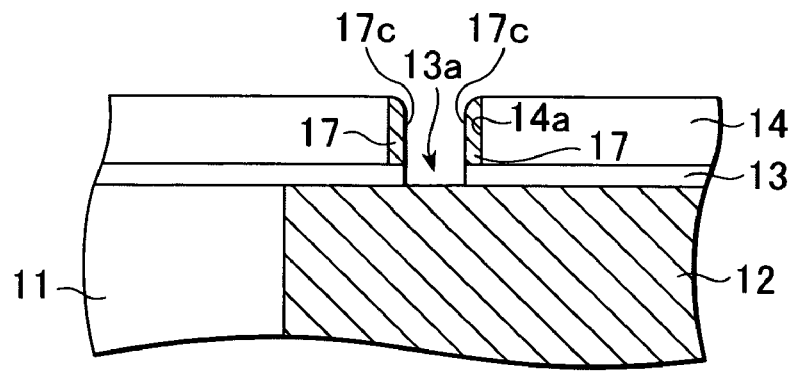
FIG. 17C is a cross-sectional view along the line P-P shown in FIG. 17A.
Figure 18A:
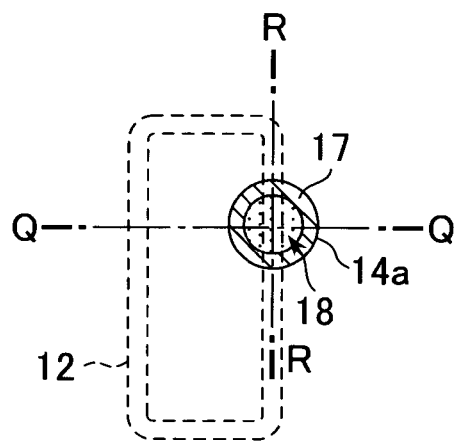
FIG. 18A is plan views illustrating the process of manufacturing the memory element according to a second embodiment of the present invention.
Figure 18B:
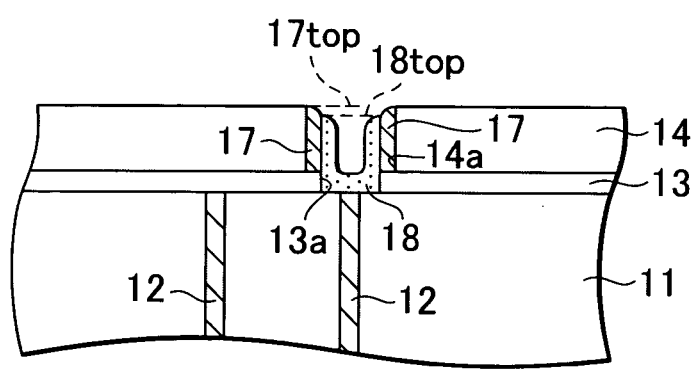
FIG. 18B is a cross-sectional view along the line Q-Q shown in FIG. 18A.
Figure 18C:
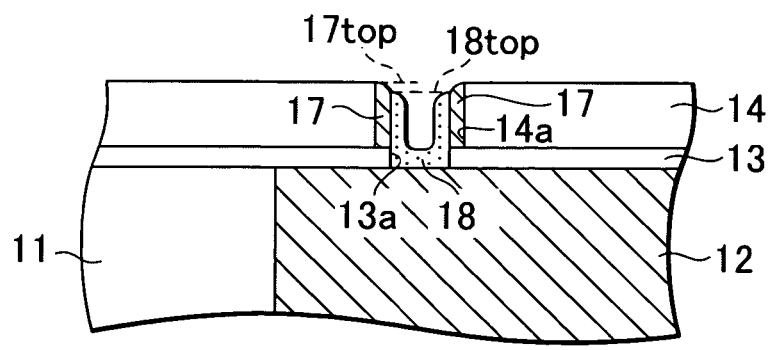
FIG. 18C is a cross-sectional view along the line R-R shown in FIG. 18A.

FIGS. 16A, 17A, and 18A are plan views illustrating the process of manufacturing the memory element 20. FIGS. 16B and 16C are cross-sectional views along lines M-M and N-N, respectively, of FIG. 16A; FIGS. 17B and 17C are cross-sectional views along lines O-O and P-P, respectively, of FIG. 17A; and FIGS. 18B and 18C are cross-sectional views along lines Q-Q and R-R, respectively, of FIG. 18A. To facilitate understanding of the drawings, in each case the portion relating to transistor 103 has been omitted.

As shown in FIGS. 16A to 16C, after the cylindrical bottom electrode 12 is formed and the region thus defined is filled with insulation material 11b, first etching stopper 13 is formed, then the interlayer insulation layer 14 is formed. The interlayer insulation layer 14 is then etched to form the through-hole 14a, exposing a portion of the first etching stopper 13 corresponding to the part in opposition to the strip-shaped region 12y of the bottom electrode 12. The through-hole 14a can be formed using the same method described with reference to the first embodiment.

Next, as shown in FIGS. 17A to 17C, the top electrode 17 is formed over the whole surface, including the inside of the through-hole 14a, and the top electrode 17 is then etched back. This removes the portion of the top electrode 17 on the part of the surface substantially parallel to the substrate, leaving only that portion of the top electrode 17 that is on the inside wall of the through-hole 14a, with the etched surface 17c of the top electrode 17 exposed.

Etching the top electrode 17 also re-exposes part of the first etching stopper 13 formed at the bottom of the through-hole 14a. Then, using the remaining portion of the top electrode 17 on the inside wall of the through-hole 14a as a mask, the first etching stopper 13 exposed at the bottom of the through-hole 14a is etched, forming the opening 13a, and thereby exposing a portion of the bottom electrode 12.

Next, as shown in FIGS. 18A to 18C, the recording layer 18 is formed over the whole surface, including inside the opening 13a and through-hole 14a. Then, the recording layer 18 is etched back. This removes all of the recording layer 18 formed outside the opening 13a and through-hole 14a, leaving just the portion of the recording layer 18 that remains in the opening 13a and through-hole 14a. Here, it is necessary to regulate the etch-back conditions so that the top 18 top of the recording layer 18 is below (i.e., on the substrate side of) the top 17 top of the top electrode 17.

Then, as shown in FIG. 15, the insulation material 21 is formed over the whole surface, including the inside of the opening 13a and through-hole 14a, and is then etched back to expose the top 17 top of the top electrode 17. After the bit line 15 is then formed and patterned, insulation layer 19 is formed over the whole surface, thereby completing the memory element 20. It is necessary to regulate the etching conditions to ensure that the top 18 top is not exposed when the insulation material 21 is being etched.

In this way, the etched surface 17c of the top electrode 17 and the growth initiation surface 18a of the recording layer 18 can be brought into contact. Also, since the bit line 15 is formed after the top electrode 17, the etched surface 17c is also in contact with the growth initiation surface of the bit line 15.

Thus, in this embodiment, the etching back of the top electrode 17 and recording layer 18 and the filling of the through-hole 14a with the insulation material 21 are followed by the forming of the bit line 15 over the through-hole 14a. Therefore, the bit line 15 can be given an adequate thickness, and it is possible to select a material having a lower resistance. As such, the line resistance of the bit line 15 can be decreased, reducing power loss in the bit line 15 and speeding up read and write operations.

The present invention is in no way limited to the aforementioned embodiments, but rather various modifications are possible within the scope of the invention as recited in the claims, and naturally these modifications are included within the scope of the invention.

What is claimed is:

1. A non-volatile memory element, comprising:
an insulating layer;
a bit line embedded into the insulating layer;
a hole selectively formed in the insulating layer to expose a part of the bit line;
a first electrode formed in the hole in contact with the part of the bit line to cap a whole of the part of the bit line;
a phase change material layer formed in contact with the first electrode;
a second electrode formed in contact with the phase change material layer; and
a transistor having an electrode electrically connected to the second electrode.

2. The non-volatile memory element as claimed in claim 1, wherein the insulating layer has an upper surface and a side surface, the side surface of the insulating layer being defined by the hole, the part of the bit line being exposed from the side surface of the insulating film, the first electrode being formed along the side surface of the insulating layer to cap the part of the bit line.

3. A non-volatile memory element, comprising:
an insulating layer;
a bit line embedded into the insulating layer;
a hole selectively formed in the insulating layer to expose a part of the bit line;
a first electrode formed in the hole in contact with the part of the bit line to cap a whole of the part of the bit line;
a phase change material layer formed in contact with the first electrode; and
a second electrode formed in contact with the phase change material layer,
wherein the insulating layer has an upper surface and a side surface, the side surface of the insulating layer being defined by the hole, the part of the bit line being exposed from the side surface of the insulating film, the first electrode being formed along the side surface of the insulating layer to cap the part of the bit line, and the phase change material layer is formed in the hole in contact with the first electrode and elongated over a part of the upper surface of the insulating layer.

4. The non-volatile memory element as claimed in claim 3, further comprising a lower insulating film, wherein the insulating layer is disposed on the lower insulating film, and the second electrode is buried in the lower insulating film and in contact with the phase change material layer at a bottom portion of the hole.

5. The non-volatile memory element as claimed in claim 1, wherein a material of the first electrode is lower in thermal conductivity than the bit line.

6. The non-volatile memory element as claimed in claim 1, wherein the electrode of the transistor is electrically connected to the second electrode without intervention of the first electrode and the bit line.

7. The non-volatile memory element as claimed in claim 6, wherein the transistor has another electrode electrically connected to a wiring layer.

* * * * *